(12) United States Patent
Bergsma

(10) Patent No.: US 7,872,529 B2
(45) Date of Patent: Jan. 18, 2011

(54) SWITCH METHOD FOR SWITCHING CLASS AMPLIFIERS

(75) Inventor: Adrian Bergsma, Kanata (CA)

(73) Assignee: Nortel Networks Limited, Mississauga, Ontario (CA)

( * ) Notice: Subject to any disclaimer, the term of this patent is extended or adjusted under 35 U.S.C. 154(b) by 48 days.

(21) Appl. No.: 12/218,147

(22) Filed: Jul. 11, 2008

(65) Prior Publication Data

US 2010/0007410 A1   Jan. 14, 2010

(51) Int. Cl.
*H03F 1/00* (2006.01)
(52) U.S. Cl. ...................................... 330/195
(58) Field of Classification Search ............... 330/10, 330/207 A, 251, 186–191, 195
See application file for complete search history.

(56) References Cited

U.S. PATENT DOCUMENTS 3,742,330 A * 6/1973 Hodges et al. ............... 363/41

OTHER PUBLICATIONS

Herbert L. Krauss, et al., "Solid State Radio Engineering", 1980, 5 pages.

* cited by examiner

*Primary Examiner*—Robert Pascal
*Assistant Examiner*—Khiem D Nguyen
(74) *Attorney, Agent, or Firm*—Robert D. McCutcheon

(57) ABSTRACT

In accordance with one the present disclosure, systems and methods are disclosed that include transmitting a binary signal from a signal source into a switch where the switch is in series between the signal source and a first circuit element. In addition, the switch is operating substantially in a switched mode and creates a switched output signal and the switch is controlled by the binary signal. Also disclosed in this method is detecting a negative voltage in a signal from a second circuit element. In this method the first circuit element is in series between the second circuit element and the switch, and upon detecting the negative voltage from the second circuit element the first circuit element creates high impedance in the first circuit element.

20 Claims, 5 Drawing Sheets

SWITCH METHOD FOR SWITCHING CLASS AMPLIFIERS

TECHNICAL FIELD

The present disclosure relates to amplifiers and in particular to methods of operating switching class amplifiers.

BACKGROUND

Power amplifiers of the Class-A and Class-AB type have been employed as radio frequency (RF) power amplifiers for cellular base station and other RF systems. These amplifiers are based on the operation of a transistor primarily in its linear mode and are used in audio or other lower frequency operations. One problem with operation in linear mode is their limited ability to efficiently amplify RF signals.

In order to overcome this limitation, a new class of switching amplifiers has been developed. These amplifiers use transistors operating in a highly nonlinear mode, referred to as switch mode. The operation of transistors in the switched mode results in amplifiers with a higher efficiency than those that operate in a linear mode.

Switching mode amplifiers have seen many years of use in various electronic systems including audio and RF power amplifiers and switching power supply circuits. One example of a switching mode amplifier is a Class-D amplifier. Other examples of switching class amplifiers include, but are not limited to E, F, and S class amplifiers.

The Class-D amplifier architecture may be used in a plurality of applications. However, these amplifiers suffer from a number of problems, including device parasitics such as drain-source capacitance and lead inductance that result in high loss of power in each cycle.

SUMMARY

In accordance with one embodiment, a method is disclosed that includes transmitting a binary signal from a signal source into a switch where the switch is in series between the signal source and a first circuit element. In addition, the switch is operating substantially in a switched mode and creates a switched output signal and the switch is controlled by the binary signal. Also disclosed in this method is detecting a negative voltage in a signal from a second circuit element. In this method the first circuit element is in series between the second circuit element and the switch, and upon detecting the negative voltage from the second circuit element the first circuit element creates high impedance in the first circuit element.

In accordance with another embodiment, a system is disclosed that includes a binary signal source and a switch coupled to the binary signal source that is controlled by the binary signal source. Also in this embodiment, a first voltage controlling element is disclosed that is coupled to the switch and a transformer. In this embodiment, the first voltage controlling element creates a high impedance state within the first voltage element in response to a negative signal from a second source.

In yet another embodiment, a system is disclosed that includes a transformer that propagates a signal. Also in this embodiment is a transistor that is coupled to the transformer and is operated in a switched mode. The transistor is controlled by a binary data source. Also in this embodiment is a signal blocker that is placed in series in between the transformer and the transistor that creates a high impedance state upon detecting a negative signal from the transformer.

Other technical features may be readily apparent to one skilled in the art from the following figures, descriptions, and claims.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

Figure 1:
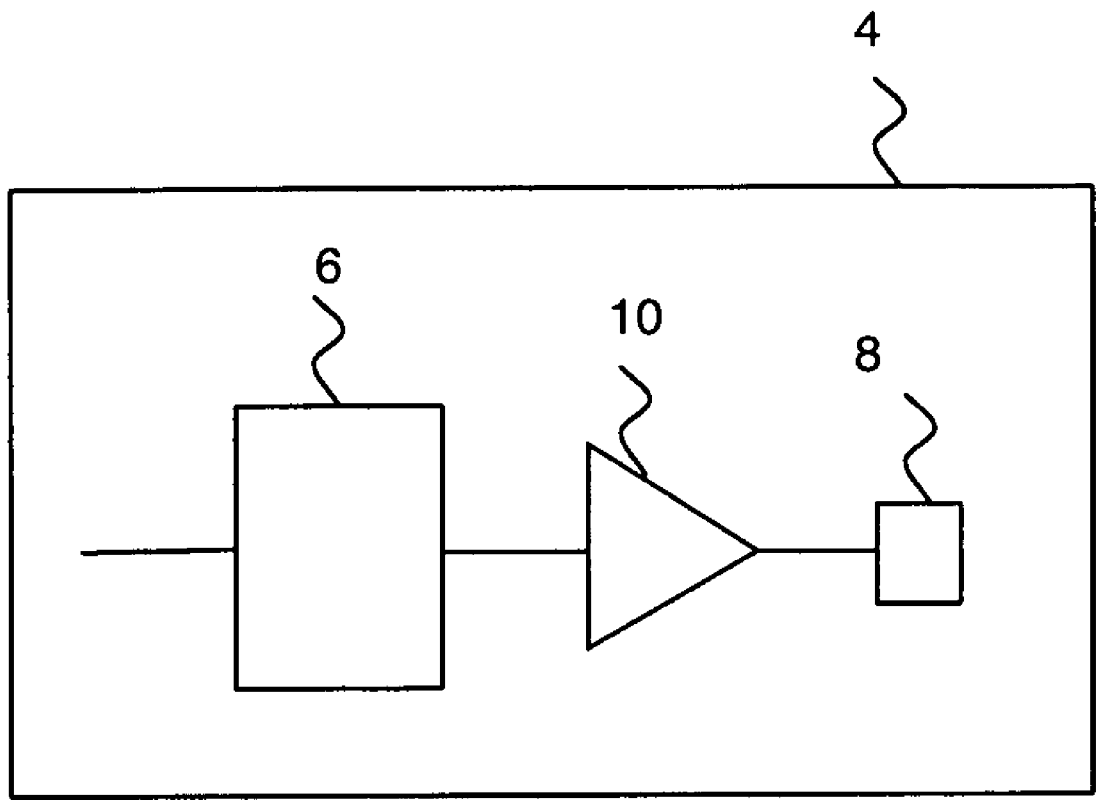
FIG. 1 depicts a high level diagram of an example system using an enhanced amplifier, in accordance with the present disclosure.

FIG. 1 illustrates an example system 4 using an enhanced amplifier 10. In this example embodiment, a signal source 6 transmits a binary digital signal into an enhanced amplifier 10. The enhanced amplifier 10 accepts the signal from the signal source 6 and transmits an amplified signal into an output device 8. The signal from the enhanced amplifier 10 may be conditioned or filtered prior to being input to the output device 8. Enhanced amplifier 10 includes a plurality of components for enhancing the efficiency of the enhanced amplifier 10.

During operation of system 4 using a non-enhanced amplifier, if the signal source 6 is a waveform that contains switching events that are not harmonically related to the natural frequency of the non-enhanced amplifier, the non-enhanced amplifier may experience significant negative voltages across the drain source channels of the transistors within the non-enhanced amplifier. These negative voltages can create bias conditions for the non-enhanced amplifier resulting in an undesired conduction path that interferes with proper operation of the non-enhanced amplifier.

Utilizations of the enhanced amplifier 10 having an element, such as a forward biased diode, that effectively presents high impedance in series with an open switch and low impedance in series with a closed switch within the amplifier, allows for operation of the enhanced amplifier 10 without being adversely affected by the negative voltages. Therefore, the enhanced amplifier 10 is more efficient than the non-enhanced amplifier.

Figure 2:
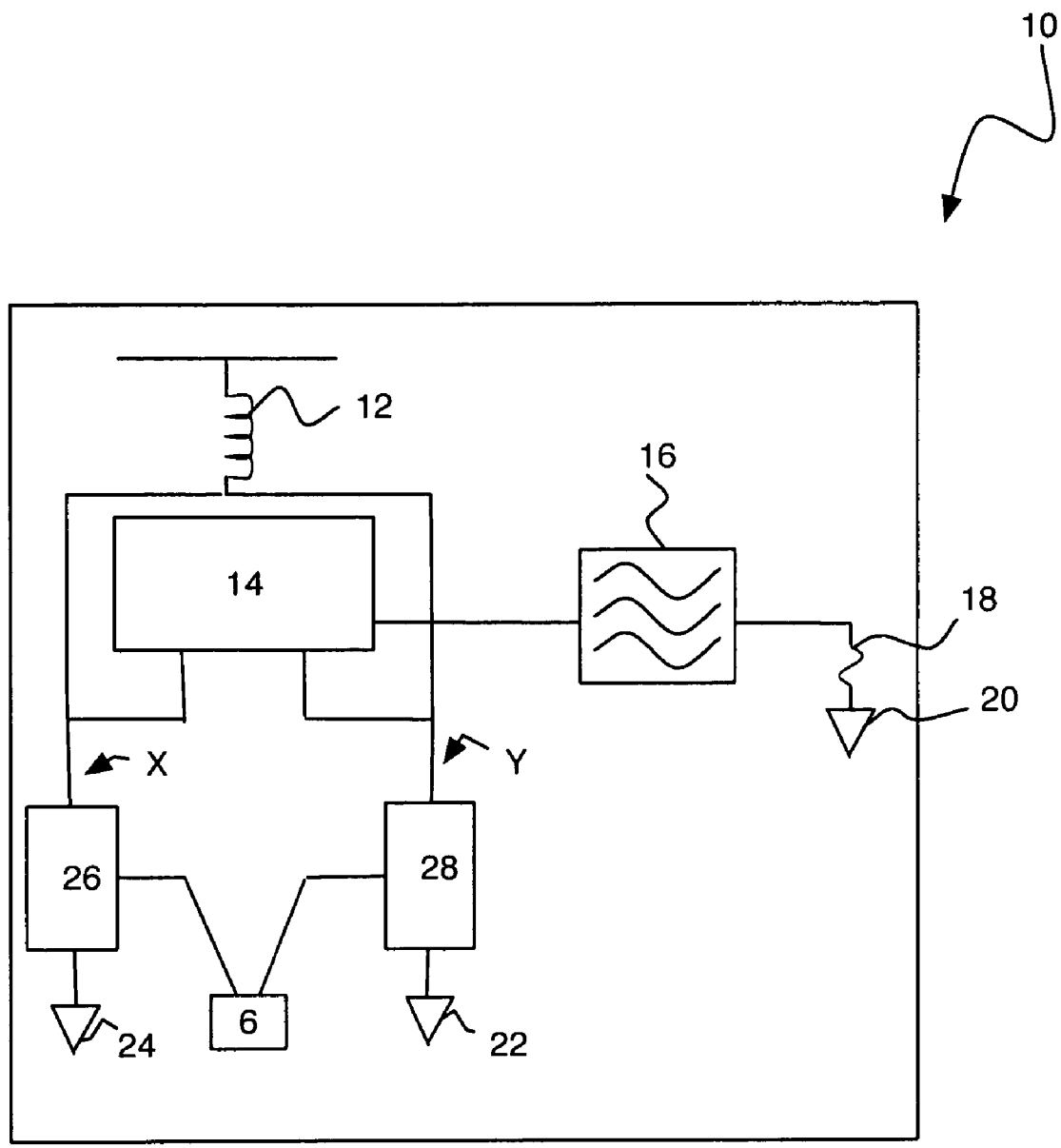
FIG. 2 is a block diagram of an example embodiment of a system using an enhanced amplifier, in accordance with the present disclosure.

FIG. 2 is a diagram of one example embodiment of enhanced amplifier 10. In this embodiment, a choke 12 is coupled to a voltage source (not shown) and a first switch unit 26 and a second switch unit 28. A first side of a transformer 14 is coupled to the first switch unit 26 and the second switch unit 28, while a second side is connected to a filter 16 and ground.

Signal source 6 is coupled to the first switch unit 26 and the second switch unit 28. Signal source 6 transmits a binary digital signal used as a control signal into the first switch unit 26 and the second switch unit 28. A filter 16 is coupled to a load 18.

When a supply voltage signal is applied to the choke 12, the choke 12 provides a DC bias current Idd to the first switch unit 26 and the second switch unit 28. Each switch, when closed, receives a signal equal to the bias current Idd resulting in the effective switching of the bias current Idd alternately between switch 26 and switch 28. As shown in FIG. 2, the outputs of the first switch unit 26 and the second switch unit 28 are coupled together through the transformer 14.

By opening and closing the switches 26 and 28 in a complementary, alternating fashion, the currents supplied by the choke 12 are converted into an output signal by the transformer 14. The output signal is transmitted through the filter 16 and then delivered to the load 18. However, there may be errors in the switching process. In such a case, the first switch unit 26 and the second switch unit 28 may be exposed to a negative signal. These signals can cause damage to the first switch unit 26 and the second switch unit 28. Enhanced amplifier 10 overcomes these problems through additional circuit elements. One of each of these additional circuit elements is placed in series between the switch unit 26 and rest of the circuit, for example, the transformer 14 and the choke 12. Another additional circuit element is placed in series between the switch unit 28 and rest of the circuit, for example, the transformer 14 and the choke 12.

Since the signals created by the first switch unit 26 and the second switch unit 28 may not be directly inverses of each other, a two-sided signal may be created. The phrase "two-sided signal" relates to a signal with two main components, consisting of a first signal that is created on one side of the amplifier (e.g., first switch unit 26) and another signal that is created on the other side of the amplifier (e.g., second switch unit 28). In general, these signals are not direct inverses of each other as in a differential circuit, and are generally time shifted from each other and ideally non-overlapping in time and are ideally always positive relative to the negative supply voltage. A two-sided signal may also damage the first switch unit 26 and the second switch unit 28.

The first switch unit 26 and the second switch unit 28 comprise circuit elements that allow current flowing in the choke 12 to be directed to the first switch unit 26 or the second switch 28. For example, if the first switch unit 26 is closed, it presents a low impedance path to ground for current in the choke 12. At the same time, the switch 28 will be open, presenting a high impedance path to ground. This directs the current to flow to the first switch unit 26. The operation of the first switch unit 26 may be substantially similar to the second switch unit 28.

The output signal is also transmitted into the filter 16. The filter 16 removes undesired frequencies from the signal. The filter 16 is connected to the load 18 and the ground 20.

It is understood that the enhanced amplifier 10 may use any kind of transistor. Examples of transistors that may be used in the first switch unit 26 and the second switch unit 28 include, but are not limited to, field-effect transistor (FET), bipolar junction transistor (BJT), and Pseudomorphic High Electron Mobility Transistors (PHEMT). It is further understood that during the normal operation of the transistor, a negative voltage may be introduced onto the drain or collector of the transistor or be created by the transistor. Therefore, not only does the enhanced amplifier 10 compensate for negative voltages from a transformer, but also from other external sources (e.g., other inputs into the transistor) as well as internal sources (e.g., transistor operation).

The choke 12 may, in some embodiments, be an inductor that has a large inductance value. The choke 12 may have a low DC resistance and very high AC/RF impedance. It is understood that the choke 12 may supply DC current to the circuit with low levels of AC/RF current. In other embodiments, choke 12 could be replaced with a DC current source.

The transformer 14 is configured to take the difference between the components of a two sided signal to create a composite signal. Signals coming into the transformer 14 ideally have substantially positive component relative to the negative voltage supply. When those signals leave the transformer 14, they will have a positive and a negative component relative to ground. The effect of the transformer 14 is to subtract the signals present at nodes X and Y (where X is the node between the switch 26 and the transformer 14 and Y is the node between the switch 28 and the transformer 14 in FIG. 2).

The first switch unit 26 comprises at least one-transistor capable of operating in a saturated or switched mode and one voltage-controlling element. One example of the voltage-controlling element is a diode. In the operation of the switching element, there exists the possibility that the voltage across the first switch unit 26 may become negative. The negative signal may be from any source, including the transformer 14. In such an event, the first switch unit 26 may become damaged or turned on upside down. When the transistor is "turned on upside down" it has effective impedance that is low when it should be high. This condition interferes with the proper operation of the circuit and introduces high inefficiencies. Through the use of a voltage-controlling element in series with the switch, when the voltage entering the first switch unit 26 becomes negative, the voltage-controlling element will turn off and present high impedance in series with the switch. This allows for the proper operation of the first switch unit 26 and may improve the efficiency of the first switch unit 26. It is understood that there may be slight power dissipation because of the voltage-controlling element. This power dissipation may be taken into account when designing the enhanced amplifier 10.

It is explicitly understood that while the example illustrated in FIG. 2 allows for a positive signal to be used by the first switch unit 26, it is possible to configure the enhanced amplifier 10 to only use negative rather than positive signals. The configuration of enhanced amplifier 10 may, in some embodiments, only require that a consistent state of operation (e.g., positive or negative) be used during the operation of the enhanced amplifier 10.

The ground 20, as with other grounds used throughout this disclosure, may relate to either a termination point of a signal, or a point at which the signal leaves the enhanced amplifier 10. The use of the term "ground" is only intended to infer that the signal within the enhanced amplifier 10 is being transmitted out of the enhanced amplifier 10. Two examples of this transmission are placing the signal to a ground state or transmitting the signal to another circuit element outside of the enhanced amplifier 10.

Figure 3:
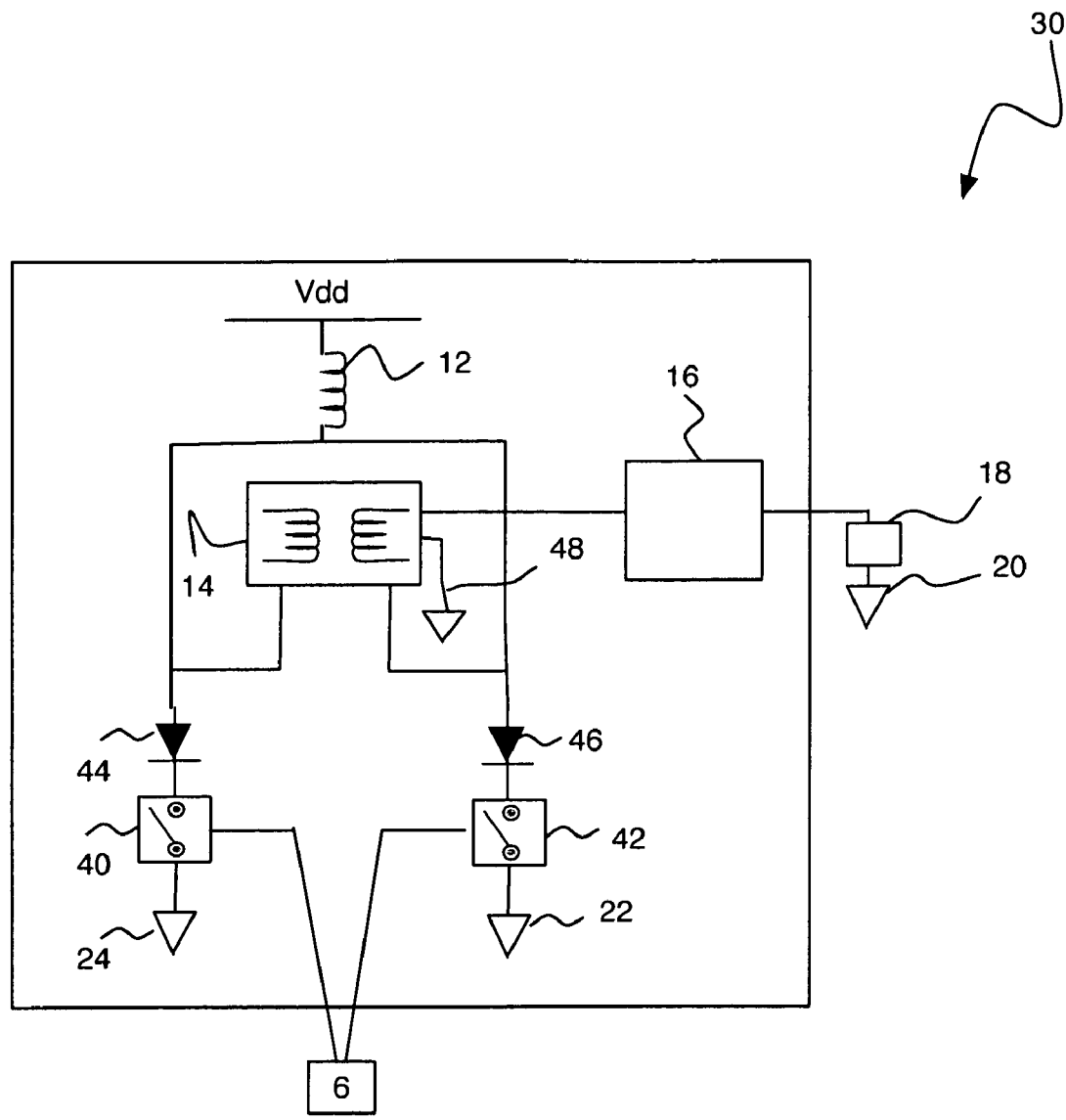
FIG. 3 is another block diagram of an example embodiment of a system using an enhanced amplifier, in accordance with the present disclosure.

FIG. 3 is a diagram of one example embodiment of the enhanced amplifier 10 and is substantially similar to the embodiment shown in FIG. 2. In FIG. 3, the first switch unit 26 has been replaced with a first diode 44 and a first transistor 40. In addition in FIG. 3, the second switch unit 28 has been replaced with second diode 46 and second transistor 42. Signal source 6 has been coupled to first transistor 40 and second transistor 42.

In the embodiment of FIG. 3, the series configuration of the first diode 44 and first transistor 40 is shown. In addition, the series configuration of the second diode 46 and the second transistor 42 is shown. In the event that the voltage at the anode of the added diode becomes negative, the diode in FIG. 3 will act as the voltage-controlling element described in FIG. 2.

Figure 4:
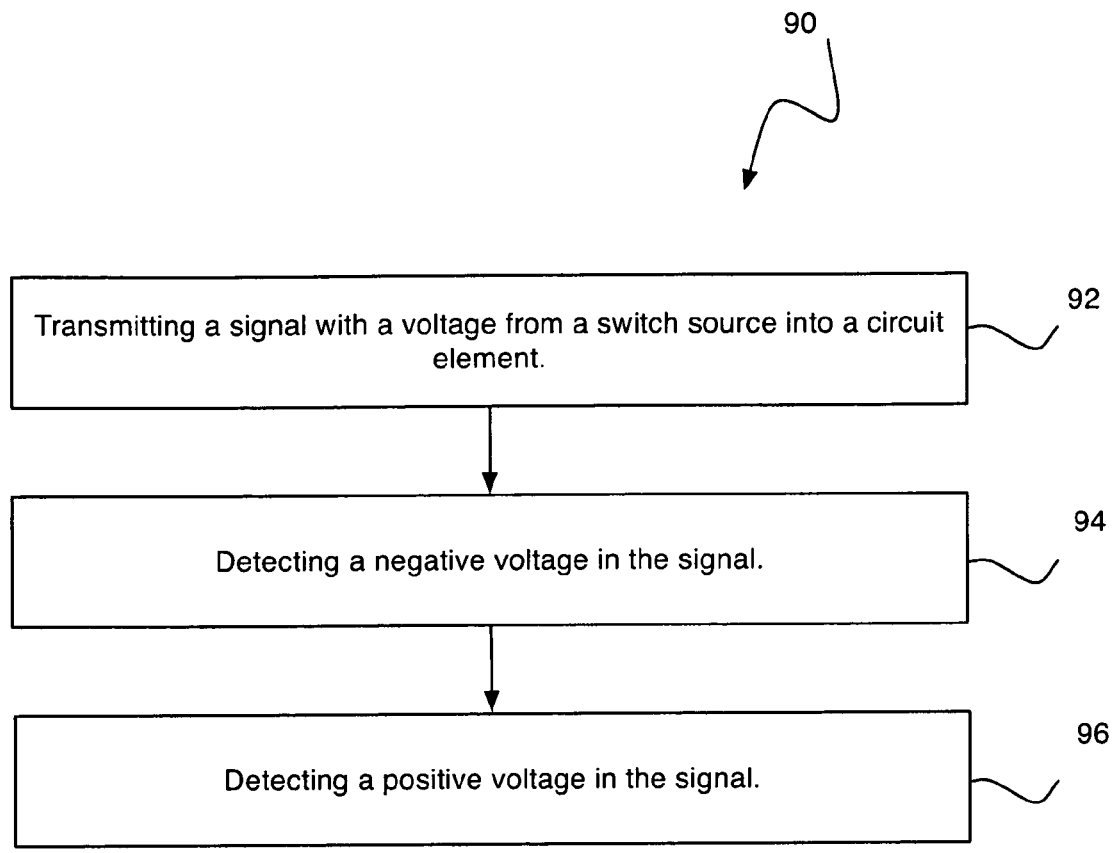
FIG. 4 is a flowchart of one method of operating an enhanced amplifier, in accordance with the present disclosure.

FIG. 4 is a flowchart 90 of one embodiment of the present disclosure. In block 92, a signal is transmitted from a switch source into a circuit element, where the circuit element is in series between the output and a switch. In block 94, a negative voltage is detected in the output signal, and upon detecting the negative voltage the circuit element creates high impedance in series with the switch and the output. In block 96, a positive voltage is detected in the signal, and upon detecting a positive voltage creating a low impedance path through the circuit element.

Figure 5:
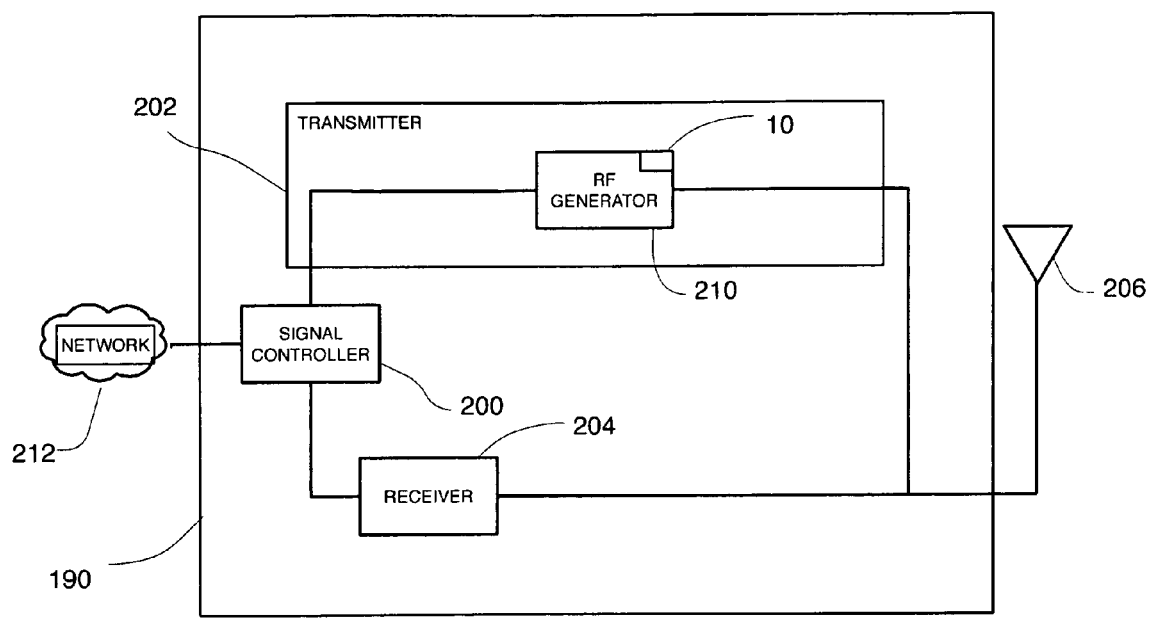
FIG. 5 is a block diagram of a communications device using an enhanced amplifier, in accordance with the present disclosure.

As shown in FIG. 5, enhanced amplifier 10 may be incorporated into a communications device 190. The exemplary communications device 190 is a medium to high-power multi-channel, two-way radio in a fixed location. Typically low-power, single-channel, two-way radios or wireless devices such as mobile phones, portable phones and wireless routers may use it. The communications device 190 may comprise a signal controller 200 that is coupled to a transmitter 202 and a receiver 204. Transmitter 202 and receiver 204 (or combined transceiver) are further coupled to an antenna 206. In the communications device 190, digital signals are processed in a channel processing circuitry. The digital signals may be signals for a wireless communication system, such as signals that convey voice or data intended for a mobile terminal (not shown). The communications device 190 may employ any suitable wireless technologies or standards such as 2G, 2.5G, 3G, GSM, IMT-2000, UMTS, iDEN, GPRS, 1xEV-DO, EDGE, DECT, PDC, TDMA, FDMA, CDMA, W-CDMA, LTE, TD-CDMA, TD-SCDMA, GMSK, OFDM, WiMAX, the family of IEEE §802.11 standards, the family of IEEE §802.16 standards, IEEE §802.20, etc. Signal controller 200 then transmits the digital signals to transmitter 202. A radio frequency (RF) generator 210 modulates the signals onto an RF signal. RF generator 210 may comprise the enhanced amplifier 10. The resulting output signal is transmitted over antenna 206 to the mobile terminal. Antenna 206 also receives signals sent to base station 190 from the mobile terminal. Antenna 206 couples the signal to receiver 204 that demodulates them into digital signals and transmits them to signal controller 200 where they may be relayed to an external network 212. Base station 190 may also comprise auxiliary equipment such as cooling fans or air exchangers for the removal of heat from the communications device 190.

In an embodiment, one or more embodiments of the enhanced amplifier 10 may be incorporated into the communications device 190 in lieu of parts, if not all, of RF generator 210, which may decrease the capital costs and power usage of the communications device 190. The power amplifier efficiency measures the usable output signal power relative to the total power input. The power not used to create an output signal is typically dissipated as heat. In large systems such as the communications device 190, the heat generated in may require cooling fans and other associated cooling equipment that may increase the cost of the communications device 190, require additional power, increase the overall size of the base station housing, and require frequent maintenance. Increasing the efficiency of the communications device 190 may eliminate the need for some or all of the cooling equipment. Further, the supply power to enhanced amplifier 10 may be reduced since it may more efficiently be converted to a usable signal. The physical size of the communications device 190 and the maintenance requirements may also be reduced due to the reduction of cooling equipment. This may enable the communications device 190 equipment to be moved to the top of a base station tower, allowing for shorter transmitter cable runs and reduced costs. In an embodiment, the communications device 190 has an operating frequency ranging from about 450 MHz to about 3.5 GHz.

It may be advantageous to set forth definitions of certain words and phrases used throughout this patent document. The terms "include" and "comprise," as well as derivatives thereof, mean inclusion without limitation. The term "or" is inclusive, meaning and/or. The phrases "associated with" and "associated therewith," as well as derivatives thereof, mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method, comprising:
    transmitting a binary signal from a signal source into a first switch and a second switch, wherein the first switch is in series between the signal source and a first circuit element, and the second switch is in series between the signal source and a second circuit element, and wherein the first switch and second switch generate a first and second switched output signal, wherein the first and second switches are operated in an alternatively complementary fashion; and
    detecting a negative voltage in a signal from a signal transforming element, and upon detecting the negative voltage from the signal transforming element the first circuit element creates a high impendance in the circuit element.

2. The method of claim 1, wherein the binary source is a sigma-delta modulation (SDM) source.

3. The method of claim 1, wherein the first circuit element is a diode.

4. The method of claim 1, wherein the second circuit element is a transistor.

5. The method of claim 1, wherein the switch is a transistor.

6. The method of claim 4, wherein the transistor is selected from a group comprising: field-effect transistor (FET), bipolar junction transistor (BJT), and Pseudomorphic High Electron Mobility Transistors (PHEMT).

7. The method of claim 5, wherein the signal transforming element is a transformer, wherein the transformer senses the switched output signal during periods when the first circuit element does not create a high impedance state in the first circuit element, and wherein the transformer adjusts an alternating current signal based upon the output switched signal, and wherein the transformer outputs a direct current signal.

8. The method of claim 7, wherein the first circuit element is a transistor.

9. The method of claim 1, wherein the switch is part of a switching class amplifier.

10. A system, comprising:
    a binary signal source;
    a first and second switch coupled to the binary signal source, wherein the first and second switch are controlled by the binary signal source, and wherein the first switch and second switch operate in an alternatively complementary fashion;

a first voltage controlling element, wherein the voltage controlling element is coupled to the first switch and a transformer;

a second voltage controlling element, wherein the second voltage controlling element is coupled to the second switch and the transformer; and wherein the first voltage controlling element creates a high impedance state within the first voltage element in response to a negative signal.

11. The system of claim 10 wherein the switch is a transistor.

12. The system of claim 11, wherein transistor is selected from a group comprising: field-effect transistor (FET), bipolar junction transistor (BJT), and Pseudomorphic High Electron Mobility Transistors (PHEMT).

13. The system of claim 10 where the voltage controlling unit is a diode.

14. The system of claim 10, where signal source is a delta-sigma modulation (SDM) source.

15. A system, comprising:

a transformer, wherein the transformer propagates a signal;

a first transistor, wherein the first transistor is coupled to the transformer through a first signal blocker, wherein the transistor is controlled by a binary data source; and a second transistor, wherein the second transistor is coupled to the transformer through a second signal blocker, wherein the second transistor is controlled by the binary data source, and wherein the first and second transistor are operated in an alternatively complementary fashion and the first and second signal blocker create a high impedance state upon detecting a negative signal.

16. The system of claim 15, wherein the transistor creates an output signal.

17. The system of claim 15 wherein the transformer propagates both positive and negative signals, and wherein the signal blocker is a diode and blocks negative signals created by the transformer.

18. The system of claim 15, wherein the signal blocker is a device that switches from a state of high resistance to low resistance.

19. The system of claim 15, wherein the transistor is a device that switches from a state of high current to a state of low current.

20. The system of claim 15, wherein the transistor is a switching class amplifier.

* * * * *